United States Patent
Hsieh et al.

[11] Patent Number: 6,140,008
[45] Date of Patent: Oct. 31, 2000

[54] INFRARED LASER IMAGEABLE, PEEL DEVELOPABLE, SINGLE SHEET COLOR PROOFING SYSTEM HAVING A CROSSLINKED THERMAL TRANSFER LAYER

[75] Inventors: Shane Hsieh, Bridgewater; Rusty Koenigkramer, Neshanic Station; Wojciech Wilczak, Jersey City, all of N.J.; Gerald A. Smith, Easton, Pa.

[73] Assignee: AGFA Corporation, Ridgefield Park, N.J.

[21] Appl. No.: 09/389,164

[22] Filed: Sep. 2, 1999

[51] Int. Cl.$^7$ .................................. G03F 7/34; G03F 7/11
[52] U.S. Cl. ...................... 430/200; 430/253; 430/271.1; 430/273.1; 430/952; 430/964
[58] Field of Search ..................................... 430/200, 253, 430/271.1, 273.1, 964, 952

[56] References Cited

U.S. PATENT DOCUMENTS

| | | | |
|---|---|---|---|
| 5,326,619 | 7/1994 | Dower et al. | 428/164 |
| 5,352,562 | 10/1994 | Takahashi et al. | 430/253 |
| 5,693,446 | 12/1997 | Staral et al. | 430/200 |
| 5,695,907 | 12/1997 | Chang et al. | 430/200 |
| 5,697,300 | 12/1997 | Lewis et al. | 101/467 |
| 5,721,087 | 2/1998 | Yokoya et al. | 430/200 |
| 6,051,318 | 4/2000 | Kwon | 430/200 |

FOREIGN PATENT DOCUMENTS

WO93/03928  8/1992  WIPO .

*Primary Examiner*—Richard L. Schilling
*Attorney, Agent, or Firm*—Roberts & Mercanti, LLP

[57] ABSTRACT

The invention relates to a peel-apart, single sheet color proofing system capable of producing a negative image on a receiver sheet upon exposure to infrared laser radiation and peel development. The invention provides a negative working thermal imageable element for infrared laser imaging having a substantially transparent substrate, an infrared radiation sensitive, crosslinked thermal transfer layer on a surface of the substrate having a substantially uniform admixture of carbon black and a crosslinked polymer, a color layer on the crosslinked thermal transfer layer having a substantially uniform admixture of an organic binder and a colorant, and a thermoplastic adhesive layer on the color layer. The invention also provides a method for producing a negative image and a method for producing a negative working thermal imageable element.

21 Claims, No Drawings

INFRARED LASER IMAGEABLE, PEEL DEVELOPABLE, SINGLE SHEET COLOR PROOFING SYSTEM HAVING A CROSSLINKED THERMAL TRANSFER LAYER

BACKGROUND OF THE INVENTION

1. Field of the Invention

The present invention relates to color proofing films. More particularly, the invention pertains to a peel-apart, single sheet color proofing system capable of producing negative images upon exposure to infrared laser radiation and peel development.

2. Description of the Related Art

In the graphic arts, it is desirable to produce a three or more color proof to assist in correcting a set of color separation films prior to using them to produce printing plates. The proof should reproduce the color quality that will be obtained during the printing process. The proof must be a consistent duplicate of the desired halftone image. Visual examination of a color proof should show the color rendition to be expected from press printing using the color separations and any defects on the separations which might need to be altered before making the printing plates.

Color proofing sheets for multicolored printing can be made by using a printing press or proof press. This requires that all of the actual printing steps be performed. Therefore, this conventional method of color proofing is costly and time consuming. Color proofing films can also be used to simulate printing. There are two general types of color proofing methods, namely the overlay type and the single sheet type.

In the overlay type of color proofing method, an independent transparent plastic support is used for producing an image of each color separation film by applying a photosensitive solution of the corresponding color. A plurality of such supports carrying images of the corresponding colors are then superimposed upon each other over a white sheet to produce a color proofing composite. The primary advantage of the overlay method is that proofs can be made quickly and can serve as a progressive proof by combining any two, three or more colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films on a single receiver sheet. This can be accomplished by sequentially applying colorants or colored, photosensitive layers to a single opaque support. This method more closely resembles the actual printing process and eliminates the color distortion inherent in the overlay system. Examples of such single sheet approaches are contained in U.S. Pat. Nos. 3,574,049; 3,671,236; 4,260,673; 4,366,223; 4,650,738; 4,656,114; and 4,659,642.

Peel-apart image forming elements are used in imaging processes because they are very convenient. After exposure, the element is merely exposed and peeled apart, separating exposed areas from unexposed areas. The peel development process is completely dry, with no wet processing required. There are various methods of creating a peel developed image on a receiver sheet, including ultraviolet imaging and thermal imaging methods. Thermal imaging involves exposure to infrared radiation. For example, U.S. Pat. No. 5,326,619 describes an infrared laser induced thermal imaging method involving a transfer of thermal material from a donor element to a receiver. The thermal element is a color layer and includes a black metal layer and a gas-producing polymer layer. U.S. Pat. No. 5,697,300 teaches a thermal imaging system wherein the transfer material reduces in viscosity to a flowable state. After peel development, the exposed material transfers in the flowable state to a receiver sheet and is then fused to the receiver sheet in a subsequent fusing step.

Other thermal image forming processes have been employed where the bonding strength between a thermal layer and a color layer is increased through exposure. U.S. Pat. No. 5,352,562 teaches an image forming layer is exposed to light and the bonding strength between the image forming layer and a light-heat conversion layer is increased. After peel development the unexposed image remains on a receiver sheet. WO 93/03928 teaches a peel-apart, laser-induced thermal imaging process wherein exposure to infrared radiation increases the bond strength between an infrared radiation absorbing element and a support, leaving unexposed areas on a receiver sheet after peel development.

It has now been unexpectedly found that a thermal imageable element sequentially having a substrate, a crosslinked thermal transfer layer, a color layer and a thermoplastic adhesive layer will show a reduced bond strength between the crosslinked thermal transfer layer and a color layer at exposed areas after exposure to infrared radiation resulting in the transfer of underlying portions of the colored layer to the adhesive layer on the receiver sheet without any transfer of the crosslinked thermal transfer layer. The unexposed areas remain on the crosslinked thermal transfer layer on the substrate.

The crosslinked thermal transfer layer comprises carbon particles in a crosslinked polymer which is capable of converting infrared laser radiation to thermal energy. This layer is heat crosslinked after coating to withstand solvent attack of subsequent coating operations of the color layer. Since carbon particles are trapped in the crosslinked thermal transfer layer, it can not be rubbed off the surface of the film during the coating operation, and no ablation transfer of carbon particles is possible when the film is infrared imaged. The density of this crosslinked thermal transfer layer is controlled so that the conversion of infrared laser radiation to thermal energy is most efficient. The adhesion between the crosslinked thermal transfer layer and the color coats can be controlled by varying the crosslinking agents, incorporating additional polymeric binder, or additives.

SUMMARY OF THE INVENTION

The invention provides a negative working thermal imageable element for infrared laser imaging which comprises a substantially transparent substrate, an infrared radiation sensitive, crosslinked thermal transfer layer on a surface of the substrate which comprises a substantially uniform admixture of carbon black and a crosslinked polymer, a color layer on the crosslinked thermal transfer layer which comprises a substantially uniform admixture of an organic binder and a colorant, and a thermoplastic adhesive layer on the color layer.

The invention also provides a method for producing a negative image which comprises:

(A) providing a thermal imageable element which comprises a substantially transparent substrate, an infrared radiation sensitive, crosslinked thermal transfer layer on a surface of the substrate which comprises a substantially uniform admixture of carbon black and a crosslinked polymer, a color layer on the crosslinked thermal transfer layer which comprises a substantially uniform admixture of an organic binder and a colorant, and a thermoplastic adhesive layer on the color layer; (B) laminating the thermal imageable element to a receiver sheet via the thermoplastic adhesive layer; (C) imagewise exposing the thermal imageable element through the substrate to sufficient infrared radiation to heat the crosslinked thermal transfer layer; (D) peeling apart the receiver sheet and the substrate, and transferring the portions of the color layer underlying the exposed areas of the crosslinked thermal transfer layer attached to the receiver sheet via the adhesive layer and leaving the portions of the color layer underlying the unexposed areas of the crosslinked thermal transfer layer on the crosslinked thermal transfer layer and the substrate, thereby forming a colored negative image on the receiver sheet; and (E) optionally repeating steps A) through D) at least once wherein another thermal imageable element having at least one different color layer is laminated via its adhesive layer to the negative image previously produced on the receiver sheet.

The invention further provides a method for producing a negative working thermal imageable element which comprises applying a crosslinkable layer onto a surface of a substantially transparent substrate which layer comprises a substantially uniform admixture of carbon black, a crosslinkable polymer, and a crosslinking agent, crosslinking the crosslinkable polymer with the crosslinking agent to form a crosslinked thermal transfer layer, applying a color layer onto the crosslinked thermal transfer layer, which color layer comprises a substantially uniform admixture of an organic binder and a colorant, and applying a thermoplastic adhesive layer onto the color layer.

DETAILED DESCRIPTION OF THE PREFERRED EMBODIMENT

In the usual full color proofing system, four distinct colored images are formed, namely magenta, cyan, yellow, and black. When the images are superimposed upon each other, a simulated full color reproduction results. In carrying out the method of the invention, one employs a thermal imageable element which broadly comprises a substantially transparent substrate, an infrared radiation sensitive, crosslinked thermal transfer layer on a surface of the substrate which comprises a substantially uniform admixture of carbon black and a crosslinked polymer, a color layer on the crosslinked thermal transfer layer which comprises a substantially uniform admixture of an organic binder and a colorant and a thermoplastic adhesive layer on the color layer.

The substrate serves for supporting the various layers of the thermal imageable element. In the preferred embodiment, the substrate may be composed of any suitable flexible sheet material provided it is transparent to infrared radiation. In the preferred embodiment, the material of the substrate preferably has a high mechanical strength, an excellent heat-resistance and a high solvent-resistance. It should have substantially no change in dimensions under heating in the range of approximately 60° C. to 120° C. during lamination. Further, in the case that exposure of the thermal imageable element to radiation is conducted through the substrate, the substrate is required to have a large transmittance at the wavelength of the infrared radiation source used for the exposure. Accordingly, the support preferably is transparent.

Preferred materials for the substrate include polyesters such as polyethylene terephthalate (PET), polycarbonates, polystyrenes, cellulose derivatives such as cellulose triacetate, polyolefins such as polypropylene, polyacrylonitrile, polyvinyl chloride, polyvinylidene chloride, polyacrylates such as PMMA (polymethyl methacrylate), polyamides such as nylon, polyimide and polysulfone. The shape of the substrate may be in the form of either film, sheet or plate.

The preferred material is polyethylene terephthalate. In the preferred embodiment, it has a thickness of from about 1 to about 10 mils, a more preferred thickness is from about 2 to about 5 mils and most preferably from about 1 to about 3 mils. Suitable films nonexclusively include Melinex 054, 504, 505, and 582 films available from ICI, and Hostaphan 4400, 4500, and 4540 films available from Hoechst Celanese Corporation. The surface of the substrate may be smooth or it may be provided with a matte texture as with Melinex 475 film. A smooth surface is preferred because a rough surface scatters the actinic radiation and thereby reduces the resolution capability of the element. Optionally the substrate surface may be adhesion promoted to allow for increased adherence of the crosslinked thermal transfer layer to the substrate. For purposes of this invention, adhesion promotion means a surface treatment which changes the chemical nature of the surface material and causes it to more readily accept another layer thereto.

On the substrate is an infrared radiation sensitive, crosslinked thermal transfer layer. The thermal transfer layer is crosslinked to allow for reduction of the adhesive strength between the crosslinked thermal transfer layer and the color layer after exposure to sufficient infrared radiation. The crosslinked thermal transfer layer is made by first applying a crosslinkable layer onto a surface of a substantially transparent substrate, wherein the crosslinkable layer comprises a substantially uniform admixture of carbon black, organic binders, a crosslinkable polymer, and a crosslinking agent. Next the crosslinkable polymer is crosslinked with the crosslinking agent such as by heating the crosslinkable layer to form a crosslinked thermal transfer layer. The crosslinked thermal transfer layer therefore comprises a substantially uniform admixture of carbon black bound in a matrix of an organic binder and a crosslinked polymer, wherein the crosslinked polymer is the reaction product of a crosslinkable polymer and a crosslinking agent.

The crosslinked polymer preferably is a polymer having phenolic groups. The phenolic groups can comprise, for example, a novolak (cresol-formaldehyde resin), polyhydroxystyrene homo- and co-polymer, acrylic polymers containing phenolic groups, or a mixture thereof. The crosslinked polymer may also be a crosslinked polyhydroxystyrene, a crosslinked novolak or a mixture thereof. Crosslinking of the polymer can be achieved, for example, by the use of crosslinking agents such as melamine formaldehyde resins, polyisocyanates, urea-formaldehyde resins, epoxy resins, aziridines, acrylic monomers under suitable conditions of heat and/or light, or mixtures thereof. Melamine formaldehyde resins and aziridines are preferred. Suitable crosslinkers include trimethylolpropane tris[3-(2-methylaziridinyl)propanoate, which is sold under the trade names Ionac PFAZ 322 available commercially from Cybron Chemical, Inc. of Birmingham, N.J. and NeoCryl CX-100 available commercially from Zeneca Resins of Wilmington, Mass. Another effective crosslinker is the polymer generated by reaction of 1,3,5-triazine-2,4,6-triamine with formaldehyde, sold commercially as Cymel 350 or Cymel 385 available commercially from Cytec of West Paterson, N.J. Cymel 303 melamine formaldehyde is preferred. The most preferred crosslinker is a compound containing at least two aziridine groups. The most preferred aziridine crosslinker is Hydroflex XR-2990 which is commercially available from H. B. Fuller Company of St. Paul, Minn. The amount of the crosslinker in the coating composition ranges from at about 2% to about 30%, preferably from about 5% to about 15%, more preferably from about 10% to about 13% based on the dry weight of the coating composition prior to crosslinking. The crosslinked thermal transfer layer is applied from a solvent coating composition onto the cover sheet and should be insoluble in solvents used to coat the subsequent layer. Useful solvents include organic solvents as well as water. The amount of the crosslinkable polymer in the coating composition ranges from at about 15% to about 75%, preferably from about 30% to about 60%, more preferably from about 40% to about 50% based on the dry weight of the coating composition prior to crosslinking.

Carbon black is present in the crosslinked thermal transfer layer in an amount sufficient to reduce the adhesive strength between the crosslinked thermal transfer layer and the color layer after exposure to sufficient infrared radiation. The carbon black is typically dispersed with an organic binder in an organic solvent or mixture of organic solvents. They are ground to small enough particle size, with or without traditional dispersion aids, to obtain the desirable density. Preferably, carbon black comprises at least about 25% by weight of the crosslinked thermal transfer layer. Preferably, the density of the crosslinked thermal transfer layer will range from about 0.7 to about 1.5.

In the practice of the present invention, the carbon black is present in an amount sufficient to uniformly cover the substrate. It is preferably present in an amount ranging from about 10 to about 50% based on the weight of the solids in the thermal transfer layer. A more preferred range is from about 25 to about 35%.

The thermal transfer layer also contains a binding resin which not only determines the hardness and/or flexibility of the coating but is also used to control the dry development. Binding resins found suitable for the color layer are styrene maleic anhydride copolymers and their half esters, acrylic polymers and copolymers, polyamides, polyurethane, polyvinyl pyrrolidones, cellulosic resins, polyvinyl acetals, polyvinyl acetates and copolymers, and mixtures thereof. The most preferred binding resins are polyvinyl acetates and polyvinyl acetals, such as UCAR resins available from Union Carbide, and polyvinyl formal, polyvinyl butyral, polyvinyl propional, and polyurethane.

Other optional ingredients which may be present in the thermal transfer layer include tackifiers, oligomers, residual solvents, surfactants, and inert fillers. A plasticizer may also be included in the thermal transfer layer to prevent coating brittleness. Suitable plasticizers include dibutylphthalate, triarylphosphate and substituted analogs thereof.

The thermal transfer layer is applied from a solvent coating composition to the substrate and dried. Organic solvents are preferred for the thermal transfer layer because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, diacetone alcohol, and gamma-butyrolactone.

In the preferred embodiment the thermal transfer layer has a coating thickness range of from about 0.1 to about 1.0 g/m². The most preferred weight is from about 0.3 to about 0.6 g/m².

A color layer is then applied to the crosslinked thermal transfer layer. The color layer comprises at least one pigment and one or more binding resins. Pigments are included in the color layer to provide color to the image areas. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer.

Nonexclusive examples of pigments usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these are products of Hoechst AG. They can be used separately or blended for a desired color.

In the practice of the present invention, a pigment is present in an amount sufficient to uniformly color the color layer. It is preferably present in an amount ranging from about 5 to about 50% based on the weight of the solids in the color layer. A more preferred range is from about 8 to about 40%.

The color layer also contains a binding resin which not only determines the hardness and/or flexibility of the coating but is also used to control the dry development. Binding resins found suitable for the color layer are styrene maleic anhydride copolymers and their half esters, acrylic polymers and copolymers, polyamides, polyvinyl pyrrolidones, cellulosic resins, polyvinyl acetals, polyvinyl acetates and copolymers, and mixtures thereof. The most preferred binding resins are polyvinyl acetates and polyvinyl acetals, such as UCAR resins available from Union Carbide, and polyvinyl formal, polyvinyl butyral and polyvinyl propional.

In a preferred embodiment of the present invention, the binder component is present in the color layer in an amount sufficient to bind the components in a uniform mixture and a uniform film when it is coated onto the crosslinked thermal transfer layer. It is preferably present in an amount ranging from about 10 to about 90% based on the weight of the solids in the color layer. A more preferred range is from about 20 to about 80%.

Other optional ingredients which may be present in the color layer include thermal polymerization inhibitors, tackifiers, oligomers, residual solvents, surfactants, inert fillers, antihalation agents, hydrogen atom donors and optical brightening agents. A plasticizer may also be included in the color layer to prevent coating brittleness and to keep the composition pliable if desired. Suitable plasticizers include dibutylphthalate, triarylphosphate and substituted analogs thereof and preferably dioctylphthalate.

The color layer is applied from a solvent coating composition to the crosslinked thermal transfer layer and dried. Organic solvents are preferred for the color layer because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, diacetone alcohol, and gamma-butyrolactone.

In the preferred embodiment the color layer has a coating thickness range of from about 0.1 to about 1.0 g/m². The most preferred weight is from about 0.3 to about 0.6 g/m².

Adhered to the color layer is a thermoplastic adhesive layer. To form the adhesive layer, the components may be emulsified or dissolved in a solvent or mixture of solvents to facilitate application of the composition to the substrate. The adhesive layer should be coated from a solvent which does not disturb the underlying color layer. Suitable solvents for this purpose nonexclusively include water, tetrahydrofuran, n-butyl acetate, isobutyl isobutyrate, glycol ethers such as propylene glycol monomethyl ether and methyl cellosolve, alcohols such as ethanol and n-propanol and ketones such as methyl ethyl ketone. Water is the preferred solvent. In general, the solvent system is evaporated from the coating composition once it is applied to an appropriate substrate. However, some insignificant amount of solvent may remain as residue.

The adhesive layer comprises one or more materials selected from the group consisting of acrylic polymers, polyvinyl acetate polymers, polyvinyl acetate/crotonic acid copolymers, polyvinyl pyrrolidone/ polyvinyl acetate copolymers, styrene maleic anhydride copolymers, polyester polymers, polyurethane polymers, and mixtures thereof. Preferred adhesive layer polymers are Mowilith 30 polyvinylacetate which is commercially available from Hoechst Celanese Corporation and Resoflex R-296 polyester which is commercially available from Cambridge Industries of America.

The adhesive layer may also optionally contain such other desired components as uv absorbers, antistatic compositions, optical brighteners, inert fillers, thermal polymerizable inhibitors, residual solvents, surfactants, antihalation agents, hydrogen atom donors, tackifiers, and plasticizers.

The adhesive layer should be transferable to a receiver sheet in a temperature range of from about 50° C. to about 180° C., preferably from about 60° C. to about 120° C., and more preferably from about 60° C. to about 100° C. when laminated with heat and pressure. Any plasticizer may be present in an amount of up to about 10% by weight and any uv absorber up to about 10% by weight. In the preferred embodiment, the adhesive layer has a coating thickness range of from about 3 to about 12 g/m$^2$. The most preferred weight is from about 8 to 10 g/m$^2$.

In use, the thusly produced thermal imageable element is then laminated to a receiver sheet. Receiver sheets may comprise virtually any material which can withstand the laminating and peel development processes. White plastic sheets, such as adhesion promoted polyester Melinex 3020 film available from ICI, are useful for this purpose. Useful receiver sheets include Melinex® 329; 339; and 994 films from ICI. Other white and non-white receiver sheets may also be used, however, rough textured and/or adhesion promoted surfaces are preferred for the receiver, which must be able to withstand the laminating and development processes. Paper, polymeric film, or plastic coated paper sheets, such as polyethylene coated paper available from Schoeller, may also be used. Other bases may include wood, glass, metal, and the like.

Lamination may be conducted by placing the adhesive layer in contact with the receiver sheet surface and then introducing the materials into the nip of a pair of heated laminating rollers under suitable pressure. Suitable laminating temperatures usually range from approximately 60° C. to 120° C., preferably from 70° C. to 100° C.

The thermal imageable element is then imagewise exposed to infrared radiation, such as in the 800 to 1100 nanometer range through a raster scanned laser in a pattern representing digital data and peel developed. Suitable laser light sources are diode lasers which discharge at a wavelength of about 830 nm, YLF (Nd-doped Yttrium Lithium Fluoride) solid state lasers which discharge at a wavelength of about 1053 nm, and Nd:YAG lasers which discharge at a wavelength of about 1064 nm. Exposure is conducted to provide sufficient energy to the element surface, such as at an energy level of from about 50 to about 250 mJ/cm$^2$, or preferably from about 100 to about 150 mJ/cm$^2$. The duration of exposure depends on the total exposure energy level selected and generally is on the order of nanoseconds to microseconds. The most appropriate exposure may be easily determined by those skilled in the art.

Before exposure of the thermal imageable element to infrared radiation it has an adhesive strength between the color layer and the crosslinked thermal transfer layer greater than the adhesive strength between the color layer and the adhesive layer. After imagewise exposure to infrared radiation it has an adhesive strength between the color layer and the crosslinked thermal transfer layer at the exposed areas which is less than the adhesive strength between the color layer and the adhesive layer. After exposure, the receiver sheet and substrate are peeled apart at room temperature with a steady, continuous motion. The preferred peel angle relative to the peel direction is greater than 90°.

After exposure to infrared laser radiation, the radiation is converted to thermal energy allowing the change in adhesive strengths between the crosslinked thermal transfer layer and the color layer. The peeling apart leaves the portions of the color layer underlying the exposed areas of the crosslinked thermal transfer layer attached to the receiver sheet via the adhesive layer and leaves the portions of the color layer underlying the unexposed areas of the crosslinked thermal transfer layer on the crosslinked thermal transfer layer and the substrate, thereby forming a colored negative image on the receiver sheet.

In order to attain a multicolored image, another thermal imageable element comprising, in order, a substantially transparent substrate, a crosslinked thermal transfer layer, a color layer and a thermoplastic adhesive layer is laminated onto the first image on the receiver sheet, imagewise exposed and the second colored element is peel developed by peeling apart the receiver sheet from the substrate of the additional thermal imageable element. The portions of the color layer underlying the exposed areas of the crosslinked thermal transfer layer of the second thermal imageable element remains with the color layer portions of the first image. A third and a fourth image may be added in a manner similar to that used to produce the second image. In the usual case, four colored layers are employed to produce a full color reproduction of a desired image. These four colors are cyan, magenta, yellow and black.

A matte finish of the final image may be obtained by embossing the shiny, top surface of the image with a matte material. This is done by laminating together the final image and matte material under pressure and temperature. The matte material is then generally removed after lamination. The advantage of this method is that the finish of the final proof can be varied. Furthermore, the matting material can be used repeatedly.

Matte films include Melinex 377 and 470 from ICI. These materials have the unique property of giving the final image a desired matte finish without any extra steps. One can control the gloss of the final image by properly selecting the matte finish. This effect works because the top layer of the final image is originally in contact with the matte material. This does not occur with a separate release layer between the matte material and thermal imageable layer. An additional advantage of coating on a matte surface is that subsequent transferred layers generally adhere better to a rough surface than to a smooth surface. A protective layer may also be laminated on top of the last peel developed layer.

The following nonlimiting examples serve to illustrate the invention. It will be appreciated that variations in proportions and alternatives in elements of the components of the radiation sensitive coating composition will be apparent to those skilled in the art and are within the scope of the present invention.

EXAMPLE 1

An infrared laser imageable multilayer element was prepared as follows:

On a 2 mil sheet of polyethylene terephthalate (PET) the following solution was coated using a #3 drawdown rod to give the thermal transfer layer:

| | | |
|---|---|---|
| 1. Propylene glycol methyl ether acetate | 27.80 g | |
| 2. Methanol | 32.26 g | |
| 3. Butyrolactone | 5.04 g | |
| 4. Black phenolic dispersion* | 32.66 g | |
| 5. Hexamethoxymethylmelamine | 0.84 g | |
| 6. P-toluenesulfonic acid | 0.41 g | |
| *The composition of the black phenolic dispersion is as follows: | | |
| Propylene glycol methyl ether acetate | 10 wt. % | |
| Methyl ethyl ketone | 70 wt. % | |
| Polyhydroxy styrene | 10 wt. % | |
| Carbon black | 10 wt. % | |

The thermal transfer layer was crosslinked in the oven at 100° C. for 10 minutes. The dry weight was 0.5 g.

On this crosslinked thermal transfer layer a color solution (Magenta) was coated using a #8 drawdown rod to give the color coat:

| | | |
|---|---|---|
| 1. Methoxy propanol | 53 g | |
| 2. Methyl ethyl ketone | 13 g | |
| 3. Diacetone alcohol | 20 g | |
| 4. Magenta pigment dispersion comprising | 13.2 g | |
| C. I Pigment R (7 wt. %), | | |
| Polyvinyl formal (8 wt. %) and | | |
| Butyrolactone (85 wt. %) | | |

The color layer was dried in the oven at 100° C. for 1 minute.

On this color layer, an adhesive solution was coated using #20 drawdown rod to give the adhesive layer:

| | | |
|---|---|---|
| 1. Mowilith 30 (polyacetate). | 20 g | |
| 2. Resoflex R-296 (polyester). | 2 g | |
| 3. N-Butyl acetate | 78 g | |

The adhesive layer was dried in the oven for 4 minutes. The dry weight was 10 g. For imagewise exposure, the above element was laminated on a Pressmatch Publication Base, available from Agfa using heat and pressure. It was mounted in a Gerber (Barco) Crescent 42T imagesetter (internal drum) and imaged by a solid state diode pumped NdYag laser with subsequent peel development by separating the PET sheet from the base. For a multicolored image, the above steps were repeated changing only the color layer to Yellow, Cyan and Black. They were laminated and exposed sucessively on the Pressmatch Publication Base carrying the first image and formed the final multicolored image after peel development.

EXAMPLE 2

The procedure of example 1 was repeated except the crosslinked thermal transfer layer was prepared as follows:

On a 2 mil sheet of polyethylene terephthalate (PET) the following solution was coated using a #3 drawdown rod to give the thermal transfer layer:

| | |
|---|---|
| 1. Propylene glycol methyl ether acetate | 27.74 g |
| 2. Methanol | 33.19 g |
| 3. Butyrolactone | 5.04 g |
| 4. Black phenolic dispersion | 32.59 g |
| 5. Hexamethoxymethylmelamine | 0.83 g |
| 6. Aluminum nitrate | 0.61 g |

The thermal transfer layer was crosslinked in the oven at 100° C. for 10 minutes. The dry weight was 0.5 g.

EXAMPLE 3

The procedure of example 1 was repeated except the crosslinked thermal transfer layer was prepared as follows:

On a 2 mil sheet of polyethylene terephthalate (PET) the following solution was coated using a #3 drawdown rod to give the thermal transfer layer:

| | |
|---|---|
| 1. Propylene glycol methyl ether acetate | 27.76 g |
| 2. Diacetone alcohol | 33.21 g |
| 3. Butyrolactone | 5.03 g |
| 4. Polyvinyl Formal | 0.15 g |
| 5. Black phenolic dispersion | 32.61 g |
| 6. Hexamethoxymethylmelamine | 0.83 g |
| 7. P-toluenesulfonic acid | 0.41 g |

The thermal transfer layer was crosslinked in the oven at 100° C. for 10 minutes. The dry weight was 0.5 g.

EXAMPLE 4

The procedure of example 1 was repeated except the crosslinked thermal transfer layer was prepared as follows:

On a 2 mil sheet of polyethylene terephthalate (PET) the following solution was coated using a #3 drawdown rod to give the thermal transfer layer:

| | |
|---|---|
| 1. Propylene glycol methyl ether acetate | 27.76 g |
| 2. Diacetone alcohol | 33.21 g |
| 3. Butyrolactone | 5.03 g |
| 4. Polyvinyl Propional | 0.15 g |
| 5. Black phenolic dispersion | 32.61 g |
| 6. Hexamethoxymethylmelamine | 0.83 g |
| 7. P-toluenesulfonic acid | 0.41 g |

The thermal transfer layer was crosslinked in the oven at 100° C. for 10 minutes. The dry weight was 0.5 g.

EXAMPLE 5

The procedure of example 1 was repeated except the crosslinked thermal transfer layer was prepared as follows:

On a 2 mil sheet of polyethylene terephthalate (PET) the following solution was coated using a #3 drawdown rod to give the thermal transfer layer:

| | |
|---|---|
| 1. Propylene glycol methyl ether acetate | 27.76 g |
| 2. Diacetone alcohol | 33.21 g |
| 3. Butyrolactone | 5.03 g |
| 4. Polyurethane | 0.15 g |
| 5. Black phenolic dispersion | 32.61 g |
| 6. Hexamethoxymethylmelamine | 0.83 g |
| 7. P-toluenesulfonic acid | 0.41 g |

The thermal transfer layer was crosslinked in the oven at 100° C. for 10 minutes. The dry weight was 0.5 g.

What is claimed is:

1. A negative working thermal imageable element for infrared laser imaging which comprises,
    (i) a substantially transparent substrate;
    (ii) an infrared radiation sensitive, crosslinked thermal transfer layer on a surface of the substrate which comprises a substantially uniform admixture of carbon black and a crosslinked polymer;
    (iii) a color layer on the crosslinked thermal transfer layer which comprises a substantially uniform admixture of an organic binder and a colorant; and
    (iv) a thermoplastic adhesive layer on the color layer.

2. The thermal imageable element of claim 1 wherein before exposure of the crosslinked thermal transfer layer to infrared radiation it has an adhesive strength between the color layer and the crosslinked thermal transfer layer greater than the adhesive strength between the color layer and the adhesive layer, and after imagewise exposure to infrared radiation has an adhesive strength between the color layer and the crosslinked thermal transfer layer at the exposed areas which is less than the adhesive strength between the color layer and the adhesive layer.

3. The thermal imageable element of claim 1 wherein surface of the substrate has been adhesion promoted.

4. The thermal imageable element of claim 1 wherein the crosslinked polymer is the reaction product of a crosslinkable polymer and a crosslinking agent.

5. The thermal imageable element of claim 4 wherein the crosslinkable polymer is a polyhydroxystyrene, a novolak or a mixture thereof.

6. The thermal imageable element of claim 4 wherein the crosslinking agent comprises a melamine formaldehyde, an aziridine or a mixture thereof.

7. The thermal imageable element of claim 1 wherein the crosslinked polymer has phenolic groups.

8. The thermal imageable element of claim 1 wherein the crosslinked polymer is a crosslinked polyhydroxystyrene, a crosslinked novolak or a mixture thereof.

9. The thermal imageable element of claim 1 wherein carbon black is present in the crosslinked thermal transfer layer in an amount sufficient to reduce the adhesive strength between the crosslinked thermal transfer layer and the color layer after exposure to sufficient infrared radiation.

10. The thermal imageable element of claim 1 wherein carbon black is present in the crosslinked thermal transfer layer in an amount of from at least about 25% by weight of the crosslinked thermal transfer layer.

11. The thermal imageable element of claim 1 wherein the density of the crosslinked thermal transfer layer ranges from about 0.7 to about 1.5.

12. The thermal imageable element of claim 1 wherein the crosslinked thermal transfer layer comprises a polyurethane or polyvinyl acetal binder.

13. The thermal imageable element of claim 1 wherein the color layer comprises at least one pigment.

14. The thermal imageable element of claim 1 wherein the color layer comprises one or more binding resins selected from the group consisting of styrene maleic anhydride copolymers and their half esters, acrylic polymers and copolymers, polyamides, polyvinyl pyrrolidones, cellulosic resins, polyvinyl acetals, polyvinyl acetates and copolymers, and mixtures thereof.

15. The thermal imageable element of claim 1 wherein the thermoplastic adhesive layer comprises one or more materials selected from the group consisting of acrylic polymers, polyvinyl acetate polymers, polyvinyl acetate/crotonic acid copolymers, polyvinyl pyrrolidone/polyvinyl acetate copolymers, styrene maleic anhydride copolymers, polyester polymers, polyurethane polymers, and mixtures thereof.

16. A method for producing a negative image which comprises:
    (A) providing a thermal imageable element which comprises,
        (i) a substantially transparent substrate;
        (ii) an infrared radiation sensitive, crosslinked thermal transfer layer on a surface of the substrate which comprises a substantially uniform admixture of carbon black and a crosslinked polymer;
        (iii) a color layer on the crosslinked thermal transfer layer which comprises a substantially uniform admixture of an organic binder and a colorant; and
        (iv) a thermoplastic adhesive layer on the color layer;
    (B) laminating the thermal imageable element to a receiver sheet via the thermoplastic adhesive layer;
    (C) imagewise exposing the thermal imageable element through the substrate to sufficient infrared radiation to heat the crosslinked thermal transfer layer;
    (D) peeling apart the receiver sheet and the substrate, and transferring the portions of the color layer underlying the exposed areas of the crosslinked thermal transfer layer attached to the receiver sheet via the adhesive layer and leaving the portions of the color layer underlying the unexposed areas of the crosslinked thermal transfer layer on the crosslinked thermal transfer layer and the substrate, thereby forming a colored negative image on the receiver sheet; and
    (E) optionally repeating steps A) through D) at least once wherein another thermal imageable element having at least one different color layer, is laminated via its adhesive layer to the negative image previously produced on the receiver sheet.

17. The method of claim 16 wherein before exposure of the crosslinked thermal transfer layer to infrared radiation has an adhesive strength between the color layer and the crosslinked thermal transfer layer greater than the adhesive strength between the color layer and the adhesive layer, and after imagewise exposure to infrared radiation has an adhesive strength between the color layer and the crosslinked thermal transfer layer at the exposed areas which is less than the adhesive strength between the color layer and the adhesive layer.

18. The method of claim 16 wherein the receiver sheet comprises paper, coated paper, or a polymeric film.

19. A method for producing a negative working thermal imageable element which comprises:

(i) applying a crosslinkable layer onto a surface of a substantially transparent substrate which layer comprises a substantially uniform admixture of carbon black, a crosslinkable polymer, and a crosslinking agent;

(ii) crosslinking the crosslinkable polymer with the crosslinking agent to form a crosslinked thermal transfer layer;

(iii) applying a color layer onto the crosslinked thermal transfer layer, which color layer comprises a substantially uniform admixture of an organic binder and a colorant; and (iv) applying a thermoplastic adhesive layer onto the color layer.

20. The method of claim 19 wherein before exposure of the thermal imageable element to infrared radiation it has an adhesive strength between the color layer and the crosslinked thermal transfer layer greater than the adhesive strength between the color layer and the adhesive layer, and after imagewise exposure to infrared radiation it has an adhesive strength between the color layer and the crosslinked thermal transfer layer at the exposed areas which is less than the adhesive strength between the color layer and the adhesive layer.

21. The method of claim 19 wherein the crosslinking is conducted by heating the crosslinkable layer.

* * * * *